United States Patent
Miyake et al.

(10) Patent No.: US 11,149,118 B2
(45) Date of Patent: Oct. 19, 2021

(54) INSULATING FILM FORMING COMPOSITION, INSULATING FILM, AND SEMICONDUCTOR DEVICE PROVIDED WITH INSULATING FILM

(71) Applicant: DAICEL CORPORATION, Osaka (JP)

(72) Inventors: Hiroto Miyake, Himeji (JP); Naoko Tsuji, Himeji (JP); Akira Yamakawa, Himeji (JP)

(73) Assignee: DAICEL CORPORATION, Osaka (JP)

( * ) Notice: Subject to any disclaimer, the term of this patent is extended or adjusted under 35 U.S.C. 154(b) by 98 days.

(21) Appl. No.: 16/612,001

(22) PCT Filed: Apr. 26, 2018

(86) PCT No.: PCT/JP2018/017078
§ 371 (c)(1),
(2) Date: Nov. 8, 2019

(87) PCT Pub. No.: WO2018/207647
PCT Pub. Date: Nov. 15, 2018

(65) Prior Publication Data
US 2021/0139652 A1   May 13, 2021

(30) Foreign Application Priority Data
May 9, 2017  (JP) .............................. JP2017-093056

(51) Int. Cl.
| C09D 183/06 | (2006.01) |
| H01L 23/29 | (2006.01) |
| C08G 77/42 | (2006.01) |
| C08G 59/32 | (2006.01) |
| C08G 59/38 | (2006.01) |
| C08G 77/14 | (2006.01) |
| C08G 77/00 | (2006.01) |

(52) U.S. Cl.
CPC .......... *C08G 77/42* (2013.01); *C08G 59/3281* (2013.01); *C08G 59/38* (2013.01); *C08G 77/14* (2013.01); *C09D 183/06* (2013.01); *H01L 23/296* (2013.01); *C08G 77/80* (2013.01)

(58) Field of Classification Search
CPC ...... C08L 83/06; C09D 183/06; H01L 23/296
See application file for complete search history.

(56) References Cited

U.S. PATENT DOCUMENTS

| 5,952,439 A | * | 9/1999 | Morita | .................... C08L 83/06 |
| | | | | 525/476 |
| 7,381,784 B2 | | 6/2008 | Nakayama | |
| 2006/0135723 A1 | | 6/2006 | Nakayama | |
| 2007/0225465 A1 | | 9/2007 | Akiike et al. | |
| 2018/0171193 A1 | * | 6/2018 | Tanaka | .................... C08L 83/06 |
| 2019/0185711 A1 | * | 6/2019 | Suwa | ...................... C08G 77/12 |

FOREIGN PATENT DOCUMENTS

| JP | 7-130728 A | 5/1995 |
| JP | 2008-179811 A | 8/2008 |
| JP | 2008-248170 A | 10/2008 |
| JP | 2014-163415 A | 9/2014 |
| WO | WO 2004/072160 A1 | 8/2004 |
| WO | WO 2005/100445 A1 | 10/2005 |
| WO | WO 2014/136805 A1 | 9/2014 |
| WO | WO 2016/204114 | * 12/2016 |
| WO | 2018/037565 | * 3/2018 |

OTHER PUBLICATIONS

International Preliminary Report on Patentability, dated Nov. 21, 2019 and Written Opinion of the International Searching Authority(Forms PCT/IB/326, PCT/IB/373 and PCT/ISA/237), dated Jul. 24, 2018, for International Application No. PCT/JP2018/017078, with an English Translation.
International Search Report, dated Jul. 24, 2018, for International Application No. PCT/JP2018/017078, with an English translation.
Extended European Search Report dated Oct. 9, 2020 for Application No. 18798281.4.

\* cited by examiner

*Primary Examiner* — Marc S Zimmer
(74) *Attorney, Agent, or Firm* — Birch, Stewart, Kolasch & Birch, LLP

(57) ABSTRACT

The present invention provides an insulating film forming composition that excels in insulating properties and heat resistance, suppresses the occurrence of warpage, and can form an insulating film with excellent adhesion. The insulating film forming composition of the present invention contains, as a polymerizable compound, a polyorganosilsesquioxane containing siloxane constituent units; wherein the total content of: constituent units represented by formula (I) [$R^aSiO_{3/2}$] (I) and constituent units represented by formula (II) [$R^aSiO_{2/2}(OR^b)$] (II) is greater than or equal to 55 mol % of the total amount of the siloxane constituent units; and the polyorganosilsesquioxane has a number average molecular weight of from 500 to 10000 and an epoxy equivalent of from 200 to 2000 g/eq.

6 Claims, No Drawings

INSULATING FILM FORMING COMPOSITION, INSULATING FILM, AND SEMICONDUCTOR DEVICE PROVIDED WITH INSULATING FILM

TECHNICAL FIELD

The present invention relates to an insulating film forming composition, an insulating film formed from a cured product of the insulating film forming composition, and a semiconductor device provided with the insulating film. The present application claims priority from JP 2017-093056 filed in Japan on May 9, 2017, the content of which is incorporated herein.

BACKGROUND ART

Insulating properties, heat resistance, and adhesion are required in the interlayer insulating film of a semiconductor device. A silica ($SiO_2$) film formed by a vacuum process such as a vapor phase growth (CVD) method has been known to be widely used as such an insulating film, but problems such as poor operation efficiency and the necessity of large-scale equipment have existed. Therefore, a Spin-On-Coat (SOD) method of forming an insulating film by coating an insulating film forming composition while rotating a semiconductor wafer, and then curing the composition thereof is attracting attention.

However, with the reduction in the thickness of semiconductor wafers in recent years, a problem has arisen with the SOD method. Namely, "warpage" occurs in the semiconductor device due to shrinkage when the insulating film forming composition is cured, and as a result, the insulating film easily delaminates. For example, Patent Document 1 describes that a polyimide film obtained by spin coating a polyamic acid and then subjecting it to dehydration condensation is used as an interlayer insulating film. However, polyamic acid undergoes significant curing shrinkage during dehydration condensation, and therefore it is difficult to suppress "warpage" of the semiconductor device, and the insulating film easily delaminates in association with the "warpage" of the semiconductor device.

Furthermore, semiconductor devices may be exposed to high temperatures of 300° C. or higher when mounting a substrate, and a difference in the coefficient of linear thermal expansion between the semiconductor wafer and the insulating film in such high temperature environments also causes "warpage".

CITATION LIST

Patent Document

Patent Document 1: JP 07-130728 A

SUMMARY OF INVENTION

Technical Problem

Therefore, an object of the present invention is to provide an insulating film forming composition that excels in insulating properties and heat resistance, suppresses the occurrence of warpage, and can be used to form an insulating film with excellent adhesion.

Another object of the present invention is to provide an insulating film that excels in insulating properties and heat resistance, suppresses the occurrence of warpage, and has excellent adhesion.

Yet another object of the present invention is to provide a semiconductor device provided with an insulating film having the aforementioned properties.

Solution to Problem

As a result of diligent research to solve the problems described above, the present inventors discovered that an insulating film forming composition containing a polyorganosilsesquioxane having a specific epoxy equivalent weight and a specific molecular weight can efficiently form a polymer through cationic polymerization, and the proportion of low molecular weight components which fails to polymerize and remains can be suppressed to a very low level; and therefore the release of the low molecular weight components (for example, release as an outgas) can be suppressed, and thereby curing shrinkage is suppressed, "warpage" of the semiconductor device caused by curing shrinkage is suppressed, an insulating film with excellent adhesion can be formed, and the cured product of the composition has excellent insulating properties and heat resistance. The present invention was completed based on these findings.

That is, the present invention provides an insulating film forming composition containing, as a polymerizable compound, a polyorganosilsesquioxane made from siloxane constituent units; wherein a total of:

constituent units represented by the following formula (I):

$$[R^a SiO_{3/2}] \quad (I)$$

[wherein, $R^a$ denotes an epoxy group-containing group, a substituted or unsubstituted aryl group, a substituted or unsubstituted aralkyl group, a substituted or unsubstituted cycloalkyl group, a substituted or unsubstituted alkyl group, a substituted or unsubstituted alkenyl group, or a hydrogen atom]; and constituent units represented by the following formula (II):

$$[R^a SiO_{2/2}(OR^b)] \quad (II)$$

[wherein, $R^a$ is the same as described above; and $R^b$ denotes a hydrogen atom or an alkyl group having from 1 to 4 carbon atoms] is greater than or equal to 55 mol % of a total amount of the siloxane constituent units; and the polyorganosilsesquioxane has a number average molecular weight of from 500 to 10000 and an epoxy equivalent weight of from 200 to 2000 g/eq.

The present invention provides the abovementioned insulating film forming composition, wherein the epoxy group-containing group is at least one type of group selected from the group consisting of the following formulas (1a) to (1d):

[Chem. 1]

(1a)

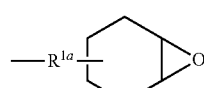

(1b)

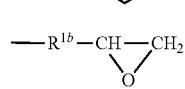

(1c)

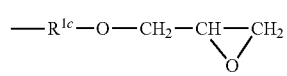

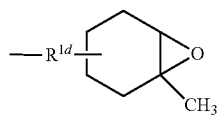

(wherein, $R^{1a}$, $R^{1b}$, $R^{1c}$, and $R^{1d}$ may be the same or different, and denote linear or branched alkylene groups).

The present invention also provides the abovementioned insulating film forming composition, further containing, as a polymerizable compound, a compound (excluding those containing a siloxane constituent unit) having at least one polymerizable group selected from an epoxy group, an oxetanyl group, a vinyl ether group, an acid anhydride group, and a phenolic hydroxyl group, at an amount in a range of 150 parts by weight or less per 100 parts by weight of the polyorganosilsesquioxane.

The present invention also provides the abovementioned insulating film forming composition, further containing a cationic polymerization initiator and/or a curing accelerator.

The present invention also provides an insulating film made from a cured product of the abovementioned insulating film forming composition.

The present invention also provides a semiconductor device provided with the abovementioned insulating film.

Advantageous Effects of Invention

The insulating film forming composition of the present invention has the above configuration, and therefore the insulating film forming composition can be coated, and subsequently subjected to photoirradiation and/or a heating treatment to form an insulating film that excels in insulating properties and heat resistance, suppresses the occurrence of warpage, and excels in adhesion. Therefore, the present invention provides excellent operation efficiency and does not require a large-scale device.

Furthermore, even in a case where the semiconductor wafer is made thinner, a semiconductor device provided with the abovementioned insulating film can suppress the occurrence of "warpage" in high temperature environments. Therefore, the present invention can support the demand for further size reduction and higher integration of semiconductor devices, and the semiconductor device can be mounted on a substrate by reflow soldering together with other components in one batch, and can be manufactured with excellent operation efficiency.

Accordingly, the insulating film forming composition of the present invention can be suitably used in insulation film forming applications for semiconductor devices (for example, a silicon-based transistor, a GnN transistor, and other such power transistors; organic transistors, and other transistors).

DESCRIPTION OF EMBODIMENTS

[Polyorganosilsesquioxane]

The polyorganosilsesquioxane according to an embodiment of the present invention contains siloxane constituent units; and a total of:

constituent units represented by the following formula (I):

$$[R^aSiO_{3/2}] \quad (I)$$

[wherein, $R^a$ denotes an epoxy group-containing group, a substituted or unsubstituted aryl group, a substituted or unsubstituted aralkyl group, a substituted or unsubstituted cycloalkyl group, a substituted or unsubstituted alkyl group, a substituted or unsubstituted alkenyl group, or a hydrogen atom]; and constituent units represented by the following formula (II):

$$[R^aSiO_{2/2}(OR^b)] \quad (II)$$

[wherein, $R^a$ is the same as described above; and $R^b$ denotes a hydrogen atom or an alkyl group having from 1 to 4 carbon atoms]

is greater than or equal to 55 mol % of a total amount of the siloxane constituent units; and the polyorganosilsesquioxane has a number average molecular weight of from 500 to 10000 and an epoxy equivalent weight of from 200 to 2000 g/eq.

The constituent unit (may be referred to as a "T3 form") represented by formula (I) above is represented by formula (I') below when described in greater detail. Furthermore, the constituent unit (may be referred to as a "T2 form") represented by formula (II) above is represented by formula (II') below when described in greater detail. Three oxygen atoms bonded to the silicon atom illustrated in the structure represented by formula (I) below are each bonded to another silicon atom (a silicon atom not illustrated in formula (I')). Moreover, two oxygen atoms located above and below the silicon atom illustrated in the structure represented by formula (II') below are each bonded to another silicon atom (a silicon atom not illustrated in formula (II')). That is, both the T3 form and the T2 form are constituent units (T units) formed by hydrolysis and condensation reactions of a corresponding hydrolyzable trifunctional silane compound.

[Chem. 2]

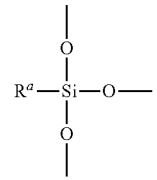

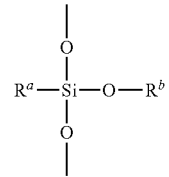

Examples of the epoxy group-containing group of $R^a$ in the above formula include groups represented by formulas (1a) to (1d) below.

[Chem. 3]

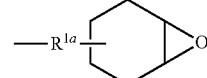

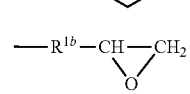

$$—R^{1c}—O—CH_2—CH\overset{O}{\underset{\diagdown}{—}}CH_2 \quad (1c)$$

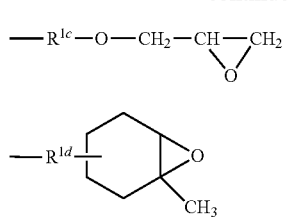

(1d)

In the formulas, $R^{1a}$, $R^{1b}$, $R^{1c}$, and $R^{1d}$ may be the same or different, and denote linear or branched alkylene groups, examples of which include linear or branched alkylene groups having from 1 to 10 carbon atoms such as a methylene group, a methyl methylene group, a dimethyl methylene group, an ethylene group, a propylene group, a trimethylene group, a tetramethylene group, a pentamethylene group, a hexamethylene group, and a decamethylene group.

Among these, a group represented by formula (1a) or (1d) above is preferable as the epoxy group-containing group from the perspective of obtaining a cured product having high heat resistance and low curing shrinkage.

$R^b$ in the formula above denotes a hydrogen atom or an alkyl group having from 1 to 4 carbon atoms. Therefore, the $(Or^b)^b$ group in the above formula is a hydroxyl group or an alkoxy group having from 1 to 4 carbon atoms. Examples of the alkoxy group having from 1 to 4 carbon atoms include a methoxy group, an ethoxy group, a propoxy group, an isopropoxy group, a butoxy group, and an isobutyloxy group.

Examples of the aryl group of the substituted or unsubstituted aryl group include a phenyl group, a tolyl group, and a naphthyl group.

Examples of the aralkyl group of the substituted or unsubstituted aralkyl group include a benzyl group and a phenethyl group.

Examples of the cycloalkyl group of the substituted or unsubstituted cycloalkyl group include a cyclobutyl group, a cyclopentyl group, and a cyclohexyl group.

Examples of the alkyl group of the substituted or unsubstituted alkyl group include linear or branched alkyl groups, such as a methyl group, an ethyl group, a propyl group, an n-butyl group, an isopropyl group, an isobutyl group, an s-butyl group, a t-butyl group, and an isopentyl group.

Examples of the alkenyl group of the substituted or unsubstituted alkenyl group include linear or branched alkenyl groups, such as a vinyl group, an allyl group, and an isopropenylgroup.

Examples of the substituted aryl group, the substituted aralkyl group, the substituted cycloalkyl group, the substituted alkyl group, and the substituted alkenyl group include a group in which some or all of the hydrogen atoms or main chain skeleton of the above-described aryl group, aralkyl group, cycloalkyl group, alkyl group, and alkenyl group are substituted with at least one type selected from the group consisting of an ether group, an ester group, a carbonyl group, a siloxane group, a halogen atom (such as a fluorine atom), an acrylic group, a methacrylic group, a mercapto group, an amino group, and a hydroxyl group.

In addition to the constituent units represented by formula (I) above and the constituent units (T units) represented by the formula (II) above, the siloxane constituent units constituting the polyorganosilsesquioxane may include at least one type of siloxane constituent unit selected from the group consisting of a constituent unit represented by $[R^a{}_3SiO_{1/2}]$ (so-called M unit), a constituent unit represented by $[R^a{}_2SiO]$ (so-called D unit), and a constituent unit represented by $[SiO_2]$ (so-called Q unit), but the proportion of T units with respect to the total amount of siloxane constituent units in the polyorganosilsesquioxane [total siloxane constituent units; total amount of M units, D units, T units, and Q units] (100 mol %) is 55 mol % or greater, for example from 55 to 100 mol %, preferably from 60 to 100 mol %, more preferably from 65 to 100 mol %, particularly preferably from 70 to 100 mol %, and most preferably from 80 to 100 mol %. By setting the aforementioned proportion to 55 mol % or greater, a cured product having high heat resistance and low curing shrinkage can be obtained. Note that $R^a$ in the above formula is the same as described above.

The number average molecular weight (Mn) of the polyorganosilsesquioxane determined by gel permeation chromatograph (GPC), calibrated with standard polystyrene, is from 500 to 10000, preferably from 700 to 5000, more preferably from 800 to 3000, even more preferably from 900 to 2800, yet even more preferably from 1000 to 2600, and particularly preferably from 1100 to 2000. The heat resistance of the cured product that is obtained is further improved by setting the number average molecular weight to 500 or higher. On the other hand, when the number average molecular weight is 10000 or less, the miscibility with other components contained in the insulating film forming composition is good.

The molecular weight dispersity (Mw/Mn) of the polyorganosilsesquioxane determined by GPC, calibrated with standard polystyrene, is, for example, from 1.0 to 3.0, preferably from 1.1 to 2.0, more preferably from 1.2 to 1.9, and particularly preferably from 1.45 to 1.80. When the molecular weight dispersity is set to 3.0 or less, the high heat resistance and the low curing shrinkage tend to further improve. On the other hand, when the molecular weight dispersity is set to 1.0 or greater, fluidity is improved, and the insulating film is more easily formed by the SOD method.

The number average molecular weight and the molecular weight dispersity of the polyorganosilsesquioxane can be measured with the instruments and conditions described in the examples.

The epoxy equivalent weight of the polyorganosilsesquioxane is from 200 to 2000 g/eq, preferably from 200 to 1800 g/eq, more preferably from 200 to 1500 g/eq, particularly preferably from 200 to 1200 g/eq, and most preferably from 205 to 1000 g/eq. A cured product having high heat resistance is obtained by setting the epoxy equivalent weight to 2000 g/eq or less. Furthermore, when the epoxy equivalent weight is set to 200 g/eq or greater, low curing shrinkage and moderate fluidity are obtained, and are suitable for the formation of an insulating film through the SOD method.

Polyorganosilsesquioxanes include complete cage-type polyorganosilsesquioxanes, incomplete cage-type polyorganosilsesquioxanes, ladder-type polyorganosilsesquioxanes, and random polyorganosilsesquioxanes, but in the present invention, of these, it is preferable to use a complete cage-type polyorganosilsesquioxane and/or an incomplete cage-type polyorganosilsesquioxane, and use of an incomplete cage-type polyorganosilsesquioxane is particularly preferable.

When an incomplete cage-type polyorganosilsesquioxane is used, there is a tendency to form a coating film having an excellent balance between the coefficient of linear thermal expansion, hardness, and curing shrinkage. On the other hand, when a ladder-type polyorganosilsesquioxane is used, the coating film tends to be too soft and the coefficient of linear thermal expansion tends to increase. Furthermore, when a complete cage-type polyorganosilsesquioxane is used, the coating film is too hard, and the resistance to thermal shock such as cracks tends to decrease, leading to a decline in reliability.

Therefore, regarding the constituent units constituting the polyorganosilsesquioxane, the molar ratio [T3 form/T2 form] of the T3 form (the constituent unit represented by formula (I) above) and the T2 form (constituent unit represented by formula (II) above) is, for example, 1 or greater, preferably 3 or greater, more preferably 5 or greater, particularly preferably 6 or greater, and most preferably 7 or greater. Moreover, the upper limit of the molar ratio is, for example, 20, preferably 18, particularly preferably 16, and most preferably 14. Note that a polyorganosilsesquioxane having a complete cage-type polyorganosilsesquioxane structure is constituted of T3 forms only, and T2 forms are not present in the molecule. Furthermore, the molar ratio [T3 forms/T2 forms] of a polyorganosilsesquioxane having a ladder-type polyorganosilsesquioxane structure is approximately 0.5 to 3.

The above ratio [T3 forms/T2 forms] in the polyorganosilsesquioxane can be determined, for example, through $^{29}$Si-NMR spectrum measurements. In the $^{29}$Si-NMR spectrum, the silicon atom in the constituent unit (T3 form) represented by formula (I) above and the silicon atom in the constituent unit (T2 form) represented by formula (II) above exhibit signals (peaks) at different positions (chemical shifts), and thus the above ratio [T3 forms/T2 forms] is determined by calculating the integration ratio of these respective peaks.

The $^{29}$Si-NMR spectrum of the polyorganosilsesquioxane can be measured, for example, with the following instrument and conditions.

Measuring instrument: Trade name "JNM-ECA500NMR" (available from JEOL Ltd.)
Solvent: Deuteriochloroform
Cumulative number of scans: 1800
Measurement temperature: 25° C.

The structure of the polyorganosilsesquioxane can be confirmed from an FT-IR spectrum. For example, a complete cage-type or an incomplete cage-type polyorganosilsesquioxane has one unique absorption peak near 1100 cm$^{-1}$, and does not have respective unique absorption peaks near 1050 cm$^{-1}$ and 1150 cm$^{-1}$ [Reference Document: R. H. Raney, M. Itoh, A. Sakakibara and T. Suzuki, Chem. Rev. 95, 1409 (1995)]. In contrast, the ladder-type polyorganosilsesquioxane has unique absorption peaks near 1050 cm$^{-1}$ and near 1150 cm$^{-1}$, respectively.

The FT-IR spectrum of the polyorganosilsesquioxane can be measured, for example, with the following instrument and conditions.

Measuring instrument: Trade name "FT-720" (available from Horiba, Ltd.)
Measurement method: Transmission method
Resolution: 4 cm$^{-1}$
Measurement wavenumber range: from 400 to 4000 cm$^{-1}$
Cumulative number of scans: 16

The polyorganosilsesquioxane according to an embodiment of the present invention can be produced by a method of hydrolysis and condensation of a hydrolyzable silane compound. More specifically, the polyorganosilsesquioxane can be produced by a method in which a hydrolyzable silane compound expressed by the following formula (a):

  (a)

is subjected to hydrolysis and condensation.

Note that $R^a$ in the formula is the same as described above. $X^1$ in the formula above may be the same or different, and denotes an alkoxy group or a halogen atom. Examples of the alkoxy group include the same examples as the alkoxy groups having from 1 to 4 carbon atoms in the (OR$^b$) group. Examples of the halogen atom include a fluorine atom, a chlorine atom, a bromine atom, and an iodine atom. Among these, $X^1$ is preferably an alkoxy group, and more preferably a methoxy group or an ethoxy group.

The hydrolyzable silane compound represented by formula (a) above is a compound that forms a constituent unit represented by formula (I), and a constituent unit represented by formula (II) above, in the polyorganosilsesquioxane according to an embodiment of the present invention.

A hydrolyzable silane compound other than the hydrolyzable silane compounds represented by formula (a) above may be used in combination as the hydrolyzable silane compound. Examples thereof include hydrolyzable trifunctional silane compounds other than the compounds represented by formula (a) above, hydrolyzable monofunctional silane compounds forming an M unit, hydrolyzable bifunctional silane compounds forming a D unit, and hydrolyzable tetrafunctional silane compounds forming a Q unit.

The usage amount and the composition of the hydrolyzable silane compound can be appropriately adjusted according to a desired structure of the polyorganosilsesquioxane. For example, the usage amount of a hydrolyzable silane compound represented by formula (a) above is not particularly limited but is preferably from 10 to 99 mol %, more preferably from 15 to 97 mol %, even more preferably from 20 to 95 mol %, particularly preferably from 25 to 90 mol %, and most preferably from 35 to 85 mol % per the total amount (100 mol %) of the hydrolyzable silane compound that is used. The polyorganosilsesquioxane obtained using the hydrolyzable silane compound represented by formula (a) in the aforementioned range can be cured to thereby form a cured product having high heat resistance and low curing shrinkage.

For example, the usage amount of the hydrolyzable silane compound represented by formula (a) is not particularly limited, but is, for example, 50 mol % or greater, more preferably from 60 to 100 mol %, particularly preferably from 70 to 100 mol %, and most preferably from 80 to 100 mol %, per the total amount (100 mol %) of the hydrolyzable silane compound that is used.

The hydrolysis and condensation reactions of the hydrolyzable silane compound can be performed in the presence or absence of a solvent. Among these options, the hydrolysis and condensation reactions are preferably performed in the presence of a solvent. Examples of the solvent include aromatic hydrocarbons, such as benzene, toluene, xylene, and ethylbenzene; ethers, such as diethyl ether, dimethoxyethane, tetrahydrofuran, and dioxane; ketones, such as acetone, methyl ethyl ketone, and methyl isobutyl ketone; esters, such as methyl acetate, ethyl acetate, isopropyl acetate, and butyl acetate; amides, such as N,N-dimethylformamide and N,N-dimethylacetamide; nitriles, such as acetonitrile, propionitrile, and benzonitrile; and alcohols, such as methanol, ethanol, isopropyl alcohol, and butanol. Among these, the solvent is preferably a ketone or ether. In addition, one type of the solvent can be used alone, or two or more types thereof can be used in combination.

The usage amount of the solvent is not particularly limited and can be appropriately adjusted in a range of from 0 to 20 parts by weight relative to a total amount of 1 part by weight of the hydrolyzable silane compound, according to the desired reaction time.

The hydrolysis and condensation reactions of the hydrolyzable silane compound are preferably performed in the presence of a catalyst and water. The catalyst may be an acid catalyst or an alkali catalyst. Examples of the acid catalyst include mineral acids, such as hydrochloric acid, sulfuric acid, nitric acid, phosphoric acid, and boric acid; phosphate esters; carboxylic acids, such as acetic acid, formic acid, and trifluoroacetic acid; sulfonic acids, such as methanesulfonic acid, trifluoromethanesulfonic acid, and p-toluenesulfonic acid; solid acids, such as activated clay; and Lewis acids, such as iron chloride. Examples of the alkali catalyst include alkali metal hydroxides, such as lithium hydroxide, sodium hydroxide, potassium hydroxide, and cesium hydroxide; alkaline earth metal hydroxides, such as magnesium hydroxide, calcium hydroxide, and barium hydroxide; alkali metal carbonates, such as lithium carbonate, sodium carbonate, potassium carbonate, and cesium carbonate; alkaline earth metal carbonates, such as magnesium carbonate; alkali metal hydrogencarbonates, such as lithium hydrogencarbonate, sodium hydrogencarbonate, potassium hydrogencarbonate, and cesium hydrogencarbonate; alkali metal organic acid salts (for example, acetates), such as lithium acetate, sodium acetate, potassium acetate, and cesium acetate; alkaline earth metal organic acid salts (for example, acetates), such as magnesium acetate; alkali metal alkoxides, such as lithium methoxide, sodium methoxide, sodium ethoxide, sodium isopropoxide, potassium ethoxide, and potassium t-butoxide; alkali metal phenoxides, such as sodium phenoxide; amines (tertiary amines and the like), such as triethylamine, N-methylpiperidine, 1,8-diazabicyclo[5.4.0]undec-7-ene, and 1,5-diazabicyclo[4.3.0]non-5-ene; and nitrogen-containing heterocyclic aromatic compounds, such as pyridine, 2,2'-bipyridyl, and 1,10-phenanthroline. Here, one type of the catalyst can be used alone, or two or more types thereof can be used in combination. In addition, the catalyst can be used in a state of being dissolved or dispersed in water, a solvent, or the like.

The usage amount of the catalyst is not particularly limited and can be appropriately adjusted in a range of 0.002 to 0.200 mol relative to a total amount of 1 mol of the hydrolyzable silane compound.

The amount of water used during the hydrolysis and condensation reactions is not particularly limited and can be appropriately adjusted in a range of from 0.5 to 20 mol relative to a total amount of 1 mol of the hydrolyzable silane compound.

The method for adding water is not particularly limited, and the total amount (total usage amount) of water to be used may be added all at once or may be added sequentially. When water is added sequentially, it may be added continuously or intermittently.

The reaction conditions for performing the hydrolysis and condensation reactions of the hydrolyzable silane compound are preferably adjusted, as appropriate, according to the structure of the target polyorganosilsesquioxane, and for example, when a polyorganosilsesquioxane having a [T3 forms/T2 forms] ratio of 5 or greater is to be produced, the reaction temperature of the hydrolysis and condensation reactions is preferably from 40 to 100° C., and more preferably from 45 to 80° C. In addition, the reaction time of the hydrolysis and condensation reactions is preferably from 0.1 to 10 hours, and more preferably from 1.5 to 8 hours. Furthermore, the hydrolysis and condensation reactions can be performed under normal pressure or can be performed under increased pressure or reduced pressure. Here, an atmosphere for performing the hydrolysis and condensation reactions is not particularly limited, and for example, may be any of an inert gas atmosphere, such as a nitrogen atmosphere and an argon atmosphere, or in the presence of oxygen, such as in the air. However, the hydrolysis and condensation reactions are preferably performed in an inert gas atmosphere.

The polyorganosilsesquioxane according to an embodiment of the present invention can be obtained by hydrolysis and condensation reactions of the hydrolyzable silane compound. After completion of the hydrolysis and condensation reactions, the catalyst is preferably neutralized to prevent the ring-opening of the epoxy group. The polyorganosilsesquioxane may be separated and purified by a separation means, such as, for example, washing with water, washing with acid, alkali washing, filtration, concentration, distillation, extraction, crystallization, recrystallization, and column chromatography, or a separation means that is a combination of these.

[Insulating Film Forming Composition]

The insulating film forming composition according to an embodiment of the present invention contains at least the polyorganosilsesquioxane described above as a polymerizable compound. One type of the polyorganosilsesquioxane described above may be contained alone, or two or more types may be contained in combination.

The insulating film forming composition according to an embodiment of the present invention may contain, as a polymerizable compound (particularly, a cationic polymerizable compound), another polymerizable compound in addition to the polyorganosilsesquioxane described above. The other polymerizable compound may be any polymerizable compound as long as it is a compound having a group that is polymerizable with (or a group having reactivity with) the epoxy group-containing group included in the polyorganosilsesquioxane, and examples include compounds (excluding those compounds containing a siloxane constituent unit) having at least one polymerizable group selected from an epoxy group, an oxetanyl group, an acid anhydride group, and a phenolic hydroxyl group. One type may be used alone, or two or more types thereof can be used in combination.

Examples of compounds (excluding those containing a siloxane constituent unit) having at least one polymerizable group selected from an epoxy group, an oxetanyl group, a vinyl ether group, an acid anhydride group, and a phenolic hydroxyl group include epoxy compounds, oxetane compounds, vinyl ether compounds, acid anhydrides, and phenolic hydroxyl group-containing compounds.

<Epoxy Compound>

The insulating film forming composition of the present invention may contain, as an epoxy compound, an alicyclic epoxy compound, an aromatic epoxy compound, and an aliphatic epoxy compound.

The epoxy equivalent weight of the epoxy compound is, for example, from 100 to 2000 g/eq. The upper limit is preferably 1500 g/eq, particularly preferably 1000 g/eq, and most preferably 500 g/eq. Moreover, the lower limit is preferably 150 g/eq, particularly preferably 180 g/eq, and most preferably 200 g/eq. A cured product having high heat resistance and low curing shrinkage can be formed by using a compound having an epoxy equivalent weight in the aforementioned range. When an epoxy compound having an epoxy equivalent weight that exceeds the aforementioned range is used, the toughness (flexibility) of the obtained cured product tends to improve, but miscibility, coating property, and heat resistance tend to decline.

(Alicyclic Epoxy Compound)

The alicyclic epoxy compound is not particularly limited, and examples include known and commonly used compounds having one or more alicyclic rings and one or more epoxy groups in the molecule. Specific examples thereof include the following compounds.

(1) A compound having an epoxy group (referred to as an "alicyclic epoxy group", examples thereof including a cyclohexene oxide group) configured of two adjacent carbon atoms and an oxygen atom that constitute an alicyclic ring in the molecule (2) A compound in which an epoxy group is directly bonded to an alicyclic ring by a single bond (3) A compound having an alicyclic ring and a glycidyl ether group in the molecule (a glycidyl ether type epoxy compound)

Examples of the compound (1) having an alicyclic epoxy group in the molecule include compounds represented by formula (i) below.

[Chem. 4]

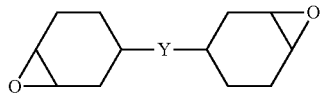
(i)

In formula (i) above, Y denotes a single bond or a linking group (a divalent group having one or more atoms). Examples of the linking group include divalent hydrocarbon groups, alkenylene groups in which some or all of the carbon-carbon double bonds are epoxidized, carbonyl groups, ether bonds, ester bonds, carbonate groups, amide groups, and groups in which a plurality thereof are linked. The cyclohexene oxide group in formula (i) may have a substituent group (for example, and a $C_{1-3}$ alkyl group).

Examples of the divalent hydrocarbon group include linear or branched alkylene groups having from 1 to 18 carbon atoms and divalent alicyclic hydrocarbon groups having from 3 to 18 carbon atoms. Examples of the linear or branched alkylene group having from 1 to 18 carbon atoms include a methylene group, a methyl methylene group, a dimethyl methylene group, an ethylene group, a propylene group, and a trimethylene group. Examples of the divalent alicyclic hydrocarbon group having from 3 to 18 carbons include cycloalkylene groups (including cycloalkylidene groups), such as a 1,2-cyclopentylene group, a 1,3-cyclopentylene group, a cyclopentylidene group, a 1,2-cyclohexylene group, a 1,3-cyclohexylene group, a 1,4-cyclohexylene group, and a cyclohexylidene group.

Examples of the alkenylene group in the alkenylene group in which some or all of the carbon-carbon double bonds are epoxidized (which may be referred to as an "epoxidized alkenylene group") include linear or branched alkylene groups having from 2 to 8 carbon atoms, such as a vinylene group, a propenylene group, a 1-butenylene group, a 2-butenylene group, a butadienylene group, a pentenylene group, a hexenylene group, a heptenylene group, and an octenylene group. In particular, the epoxidized alkenylene group is preferably an alkenylene group in which all of the carbon-carbon double bonds are epoxidized, and more preferably an alkenylene group having from 2 to 4 carbon atoms in which all of the carbon-carbon double bonds are epoxidized.

Representative examples of the alicyclic epoxy compounds represented by formula (i) above include (3,4,3',4'-diepoxy)bicyclohexyl, bis(3,4-epoxycyclohexylmethyl) ether, 1,2-epoxy-1,2-bis(3,4-epoxycyclohexan-1-yl)ethane, 2,2-bis(3,4-epoxycyclohexan-1-yl)propane, 1,2-bis(3,4-epoxycyclohexan-1-yl)ethane, and compounds represented by formulas (i-1) to (i-10) below. Note that R' in formula (i-5) below is an alkylene group having from 1 to 8 carbon atoms, and of these, a linear or branched alkylene group having from 1 to 3 carbon atoms, such as a methylene group, an ethylene group, a propylene group, or an isopropylene group, is preferable. In formulas (i-5), (i-7), (i-9), and (i-10), $n^1$ to $n^8$ may be the same or different, and each represent an integer of 1 to 30.

[Chem. 5]

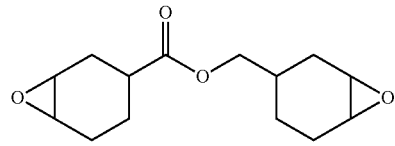
(i-1)

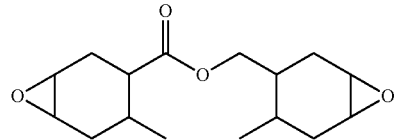
(i-2)

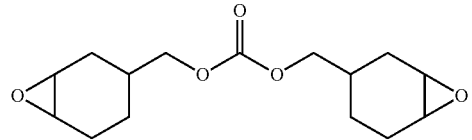
(i-3)

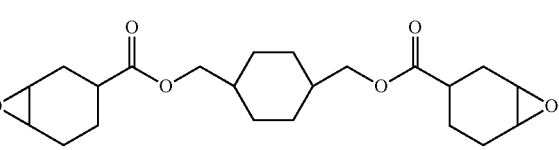
(i-4)

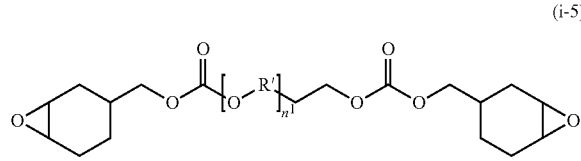
(i-5)

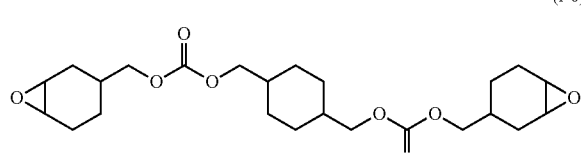
(i-6)

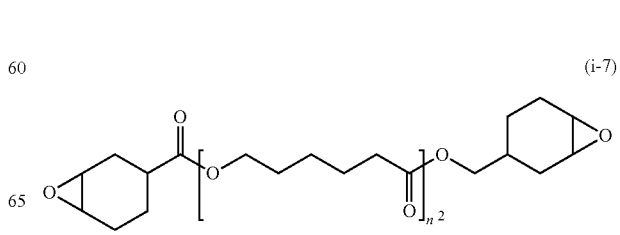
(i-7)

-continued (i-8)
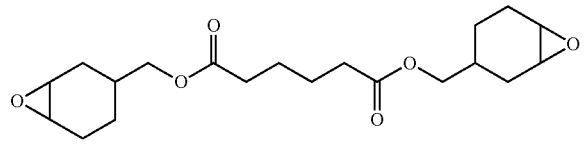

[Chem. 6]

(i-9)
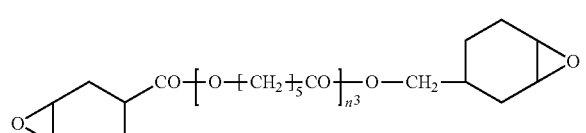

(i-10)
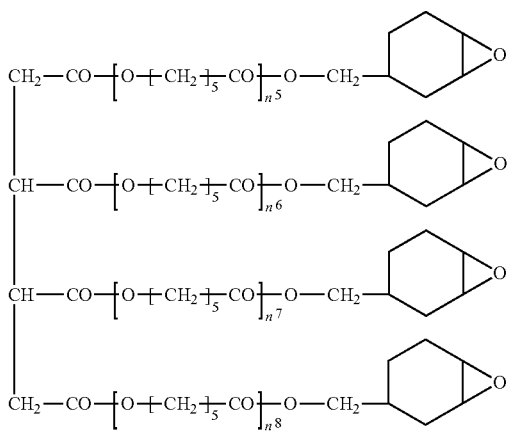

Examples of the compound (2) described above in which an epoxy group is directly bonded to an alicyclic ring with a single bond include compounds represented by formula (ii) below.

[Chem. 7]

(ii)
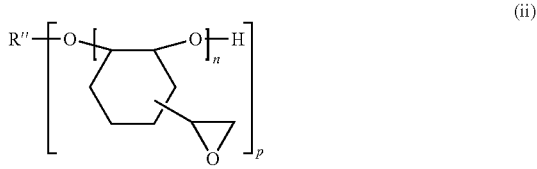

In formula (ii), R" is a group (p-valent organic group) resulting from elimination of a quantity of p hydroxyl groups (—OH) from a structural formula of a p-hydric alcohol, wherein p and n each represent a natural number. Examples of the p-hydric alcohol [R"(OH)$_p$] include polyhydric alcohols (alcohols having from 1 to 15 carbon atoms), such as 2,2-bis(hydroxymethyl)-1-butanol. Here, p is preferably from 1 to 6, and n is preferably from 1 to 30. When p is 2 or greater, n in each group within the brackets [ ] (within the outer brackets) may be the same or different. Examples of the compound represented by formula (ii) specifically include a 1,2-epoxy-4-(2-oxiranyl)cyclohexane adduct of 2,2-bis(hydroxymethyl)-1-butanol [for example, "EHPE3150" (trade name, available from Daicel Corporation)].

Examples of the above-described compound (3) having an alicyclic ring and a glycidyl ether group in the molecule include glycidyl ethers of alicyclic alcohols (in particular, alicyclic polyhydric alcohols). More particularly, examples thereof include a compound obtained by hydrogenating a bisphenol A type epoxy compound (a hydrogenated bisphenol A type epoxy compound), such as 2,2-bis[4-(2,3-epoxypropoxy)cyclohexyl]propane and 2,2-bis[3,5-dimethyl-4-(2,3-epoxypropoxy)cyclohexyl]propane; a compound obtained by hydrogenating a bisphenol F type epoxy compound (a hydrogenated bisphenol F type epoxy compound), such as bis[o,o-(2,3-epoxypropoxy)cyclohexyl]methane, bis[o,p-(2,3-epoxypropoxy)cyclohexyl]methane, bis[p,p-(2,3-epoxypropoxy)cyclohexyl]methane, and bis[3,5-dimethyl-4-(2,3-epoxypropoxy)cyclohexyl]methane; a hydrogenated bisphenol type epoxy compound; a hydrogenated phenol novolac type epoxy compound; a hydrogenated cresol novolac type epoxy compound; a hydrogenated cresol novolac type epoxy compound of bisphenol A; a hydrogenated naphthalene type epoxy compound; a compound obtained by hydrogenating an epoxy compound obtained from trisphenolmethane; and a compound obtained by hydrogenating an aromatic epoxy compound described below.

Examples of the aromatic epoxy compound include an epibis type glycidyl ether type epoxy resin obtained by a condensation reaction of bisphenols (for example, bisphenol A, bisphenol F, bisphenol S, and fluorene bisphenol) and an epihalohydrin; a high molecular weight epibis type glycidyl ether type epoxy resin obtained by further subjecting the above epibis type glycidyl ether type epoxy resin to an addition reaction with the bisphenol described above; a novolac alkyl type glycidyl ether type epoxy resin obtained by subjecting a phenol (for example, phenol, cresol, xylenol, resorcin, catechol, bisphenol A, bisphenol F, and bisphenol S) and an aldehyde (for example, formaldehyde, acetaldehyde, benzaldehyde, hydroxybenzaldehyde, and salicylaldehyde) to a condensation reaction to obtain a polyhydric alcohol, and then further subjecting the polyhydric alcohol to condensation reaction with epihalohydrin; and an epoxy compound in which two phenol skeletons are bonded at the 9-position of the fluorene ring, and glycidyl groups are each bonded directly or via an alkyleneoxy group to an oxygen atom resulting from eliminating a hydrogen atom from a hydroxy group of these phenol skeletons.

(Aliphatic Epoxy Compound)

Examples of the aliphatic epoxy compound include glycidyl ethers of a q-hydric alcohol not having a cyclic structure (q is a natural number); glycidyl esters of monovalent or polyvalent carboxylic acids (for example, acetic acid, propionic acid, butyric acid, stearic acid, adipic acid, sebacic acid, maleic acid, and itaconic acid); epoxidized materials of fats and oils having a double bond, such as epoxidized linseed oil, epoxidized soybean oil, and epoxidized castor oil; and epoxidized materials of polyolefins (including polyalkadienes), such as epoxidized polybutadiene. Here, examples of the q-hydric alcohol not having a cyclic structure include monohydric alcohols, such as methanol, ethanol, 1-propyl alcohol, isopropyl alcohol, and 1-butanol; dihydric alcohols, such as ethylene glycol, 1,2-propanediol, 1,3-propanediol, 1,4-butanediol, neopentyl glycol, 1,6-hexanediol, diethylene glycol, triethylene glycol, tetraethylene glycol, dipropylene glycol, polyethylene glycol, and polypropylene glycol; and trihydric or higher polyhydric alcohols, such as glycerin, diglycerin, erythritol, trimethylolethane, trimethylolpropane, pentaerythritol, dipentaerythritol, and sorbitol. In addition, the q-hydric alcohol may be a polyether polyol, a polyester polyol, a polycarbonate polyol, or a polyolefin polyol.

<Oxetane Compound>

The oxetane compound is not particularly limited, and examples include well-known and commonly used compounds having one or more oxetane rings in the molecule. More specific examples thereof include 3,3-bis(vinyloxymethyl)oxetane, 3-ethyl-3-(hydroxymethyl)oxetane, 3-ethyl-3-(2-ethylhexyloxymethyl)oxetane, 3-ethyl-3-[(phenoxy)methyl]oxetane, 3-ethyl-3-(hexyloxymethyl)oxetane, 3-ethyl-3-(chloromethyl)oxetane, 3,3-bis(chloromethyl)oxetane, 1,4-bis[(3-ethyl-3-oxetanylmethoxy)methyl]benzene, bis{[1-ethyl(3-oxetanyl)]methyl}ether, 4,4'-bis[(3-ethyl-3-oxetanyl)methoxymethyl]bicyclohexyl, 1,4-bis[(3-ethyl-3-oxetanyl)methoxymethyl]cyclohexane, 1,4-bis{[(3-ethyl-3-oxetanyl)methoxy]methyl}benzene, 3-ethyl-3-{[(3-ethyloxetan-3-yl)methoxy]methyl}oxetane, xylylenebisoxetane, 3-ethyl-3-{[3-(triethoxysilyl)propoxy]methyl}oxetane, oxetanylsilsesquioxane, and phenol novolac oxetane.

The oxetane equivalent weight of the oxetane compound is, for example, from 100 to 500 g/eq, preferably from 100 to 400 g/eq, and particularly preferably from 105 to 300 g/eq. A cured product having high heat resistance and low curing shrinkage can be formed by using a compound having an oxetane equivalent weight in the aforementioned range.

<Vinyl Ether Compound>

The vinyl ether compound is not particularly limited, and a well-known and commonly used compound having one or more vinyl ether groups in the molecule can be used. Examples thereof include 2-hydroxyethyl vinyl ether (ethylene glycol monovinyl ether), 3-hydroxypropyl vinyl ether, 2-hydroxypropyl vinyl ether, 2-hydroxyisopropyl vinyl ether, 4-hydroxybutyl vinyl ether, 3-hydroxybutyl vinyl ether, 2-hydroxybutyl vinyl ether, 3-hydroxyisobutyl vinyl ether, 2-hydroxyisobutyl vinyl ether, 1-methyl-3-hydroxypropyl vinyl ether, 1-methyl-2-hydroxypropyl vinyl ether, 1-hydroxymethylpropyl vinyl ether, 4-hydroxycyclohexyl vinyl ether, 1,6-hexanediol monovinyl ether, 1,6-hexanediol divinyl ether, 1,8-octanediol divinyl ether, 1,4-cyclohexane dimethanol monovinyl ether, 1,4-cyclohexane dimethanol divinyl ether, 1,3-cyclohexane dimethanol monovinyl ether, 1,3-cyclohexane dimethanol divinyl ether, 1,2-cyclohexane dimethanol monovinyl ether, 1,2-cyclohexane dimethanol divinyl ether, p-xylene glycol monovinyl ether, p-xylene glycol divinyl ether, m-xylene glycol monovinyl ether, m-xylene glycol divinyl ether, o-xylene glycol monovinyl ether, o-xylene glycol divinyl ether, ethylene glycol divinyl ether, diethylene glycol monovinyl ether, diethylene glycol divinyl ether, triethylene glycol monovinyl ether, triethylene glycol divinyl ether, tetraethylene glycol monovinyl ether, tetraethylene glycol divinyl ether, pentaethylene glycol monovinyl ether, pentaethylene glycol divinyl ether, oligoethylene glycol monovinyl ether, oligoethylene glycol divinyl ether, polyethylene glycol monovinyl ether, polyethylene glycol divinyl ether, dipropylene glycol monovinyl ether, dipropylene glycol divinyl ether, tripropylene glycol monovinyl ether, tripropylene glycol divinyl ether, tetrapropylene glycol monovinyl ether, tetrapropylene glycol divinyl ether, pentapropylene glycol monovinyl ether, pentapropylene glycol divinyl ether, oligopropylene glycol monovinyl ether, oligopropylene glycol divinyl ether, polypropylene glycol monovinyl ether, polypropylene glycol divinyl ether, isosorbide divinyl ether, oxanorbornene divinyl ether, phenyl vinyl ether, n-butyl vinyl ether, isobutyl vinyl ether, octyl vinyl ether, cyclohexyl vinyl ether, hydroquinone divinyl ether, 1,4-butanediol divinyl ether, cyclohexane dimethanol divinyl ether, trimethylolpropane divinyl, ether, trimethylolpropane trivinyl ether, bisphenol A divinyl ether, bisphenol F divinyl ether, hydroxyoxanorbornane methanol divinyl ether, 1,4-cyclohexanediol divinyl ether, pentaerythritol trivinyl ether, pentaerythritol tetravinyl ether, dipentaerythritol pentavinyl ether, and dipentaerythritol hexavinyl ether.

The vinyl ether group equivalent weight of the vinyl ether compound is, for example, from 60 to 500 g/eq, preferably from 80 to 300 g/eq, and particularly preferably from 90 to 200 g/eq. A cured product having high heat resistance and low curing shrinkage can be formed by using a compound having a vinyl ether group equivalent weight in the aforementioned range.

<Acid Anhydride>

Examples of acid anhydrides include methyltetrahydrophthalic anhydrides (4-methyltetrahydrophthalic anhydride, and 3-methyltetrahydrophthalic anhydride), methyl hexahydrophthalic anhydride (4-methylhexahydrophthalic anhydride, and 3-methylhexahydrophthalic anhydride), dodecenyl succinic anhydride, methyl endomethylene tetrahydrophthalic anhydride, phthalic anhydride, maleic anhydride, tetrahydrophthalic anhydride, hexahydrophthalic anhydride, methyl cyclohexene dicarboxylic anhydride, pyromellitic anhydride, trimellitic anhydride, benzophenone tetracarboxylic anhydride, nadic anhydride, methylnadic anhydride, hydrogenated methylnadic anhydride, 4-(4-methyl-3-pentenyl)tetrahydrophthalic anhydride, succinic anhydride, adipic anhydride, sebacic anhydride, dodecanedioic anhydride, methylcylohexene tetracarboxylic anhydride, vinyl ether-maleic anhydride copolymers, and alkyl styrene-maleic anhydride copolymers.

The acid anhydride group equivalent weight of the acid anhydride is, for example, from 100 to 500 g/eq, preferably from 100 to 300 g/eq, and particularly preferably from 100 to 200 g/eq. A cured product having high heat resistance and low curing shrinkage can be formed by using a compound having an acid anhydride equivalent weight in the aforementioned range.

<Phenolic Hydroxyl Group-Containing Compound>

Examples of the phenolic hydroxyl group-containing compound include resins in which phenol or cresol is polymerized using formaldehyde (specifically, novolac phenol resins, novolac cresol resins, paraxylylene modified phenolic resins, and paraxylylene-metaxylylene modified phenol resins).

The phenolic hydroxyl group equivalent weight of the phenolic hydroxyl group-containing compound is, for example, from 80 to 500 g/eq, preferably from 90 to 300 g/eq, and particularly preferably from 100 to 200 g/eq. A cured product having high heat resistance and low curing shrinkage can be formed by using a compound having a phenolic hydroxyl group equivalent weight in the aforementioned range.

The insulating film forming composition according to an embodiment of the present invention may contain, as a polymerizable compound, another polymerizable compound in addition to the polyorganosilsesquioxane described above, and the content amount of the other polymerizable compound (for example, an above-described compound (excluding those having a siloxane constituent unit) having at least one polymerizable group selected from an epoxy group, an oxetanyl group, an acid anhydride group, and a phenolic hydroxyl group) is, for example, 150 parts by weight or less (preferably 120 parts by weight or less, particularly preferably 110 parts by weight or less, and most preferably 100 parts by weight or less per 100 parts by weight of the polyorganosilsesquioxane. Note that the lower limit of the content amount of the other polymerizable compound is, for example, 10 parts by weight, particularly preferably 20 parts by weight, most preferably 30 parts by weight, and above all, most preferably 40 parts by weight. When the content amount of the other polymerizable compound exceeds the abovementioned range, the heat resistance of the obtained cured product tends to decrease, and the curing shrinkage rate tends to increase.

The insulating film forming composition according to an embodiment of the present invention preferably contains one or more cationic polymerization initiators. The cationic polymerization initiator is a compound capable of initiating or accelerating a polymerization reaction of a polymerizable compound (specifically, a cationic polymerizable compound) such as the polyorganosilsesquioxane according to an embodiment of the present invention.

The cationic polymerization initiator is not particularly limited, and examples thereof include polymerization initiators such as photocationic polymerization initiators (photo acid generating agents), and thermal cationic polymerization initiators (thermal acid generating agents). The present invention particularly preferably contains, of these, a photocationic polymerization initiator as a cationic polymerization initiator from the perspective of being able to shorten the curing time until the composition becomes tack free.

Well known or commonly used photocationic polymerization initiators can be used as the photocationic polymerization initiator, and examples thereof include a sulfonium salt (a salt of a sulfonium ion and an anion), an iodonium salt (a salt of an iodonium ion and an anion), a selenium salt (a salt of a selenium ion and an anion), an ammonium salt (a salt of an ammonium ion and an anion), a phosphonium salt (a salt of a phosphonium ion and an anion), and a salt of a transition metal complex ion and an anion. One type alone or two or more types thereof in combination can be used.

Examples of the anion constituting the salt in the photocationic polymerization initiator include $SbF_6^-$, $PF_6^-$, $BF_4^-$, $(CF_3CF_2)_3PF_3^-$, $(CF_3CF_2CF_2)_3PF_3^-$, $(C_6F_5)_4B^-$, $(C_6F_5)_4Ga^-$, a sulfonate anion (such as a trifluoromethane sulfonate anion, a pentafluoroethane sulfonate anion, a nonafluorobutane sulfonate anion, a methane sulfonate anion, a benzene sulfonate anion, and a p-toluene sulfonate anion), $(CF_3SO_2)_3C^-$, $(CF_3SO_2)_2N^-$, a perhalogenate ion, a halogenated sulfonate ion, a sulfate ion, a carbonate ion, an aluminate ion, a hexafluorobismuthate ion, a carboxylate ion, an arylborate ion, a thiocyanate ion, and a nitrate ion.

Examples of the sulfonium salt include a triarylsulfonium salt, such as a triphenylsulfonium salt, a tri-p-tolylsulfonium salt, a tri-o-tolylsulfonium salt, a tris(4-methoxyphenyl) sulfonium salt, a 1-naphthyldiphenylsulfonium salt, a 2-naphthyldiphenylsulfonium salt, a tris(4-fluorophenyl) sulfonium salt, a tri-1-naphthylsulfonium salt, a tri-2-naphthyldiphenylsulfonium salt, a tris(4-hydroxyphenyl)sulfonium salt, a diphenyl[4-(phenylthio)phenyl]sulfonium salt, a 4-(p-tolylthio)phenyldi-(p-phenyl)sulfonium salt; a diarylsulfonium salt, such as a diphenylphenacylsulfonium salt, a diphenyl 4-nitrophenacylsulfonium salt, a diphenylbenzylsulfonium salt, and a diphenylmethylsulfonium salt; a monoarylsulfonium salt, such as a phenylmethylbenzylsulfonium salt, a 4-hydroxyphenylmethylbenzylsulfonium salt, and a 4-methoxyphenylmethylbenzyl sulfonium salt; and a trialkyl sulfonium salt, such as a dimethylphenacyl sulfonium salt, a phenacyl tetrahydrothiophenium salt, and a dimethyl benzylsulfonium salt.

Examples of the diphenyl [4-(phenylthio)phenyl]sulfonium salt include diphenyl[4-(phenylthio)phenyl]sulfoniumhexafluoroantimonate and diphenyl[4-(phenylthio) phenyl]sulfoniumhexafluorophoshate.

Examples of the iodonium salt include "UV9380C" (trade name, a bis(4-dodecylphenyl) iodonium=hexafluoroantimonate 45% alkyl glycidyl ether solution, available from Momentive Performance Materials Japan LLC), "RHODORSIL PHOTOINITIATOR 2074" (trade name, tetrakis (pentafluorophenyl) borate=[(1-methylethyl)phenyl](methylphenyl)iodonium, available from Rhodia Japan Ltd.), "WPI-124" (trade name, available from Wako Pure Chemical Industries, Ltd.), a diphenyliodonium salt, a di-p-tolyliodonium salt, a bis(4-dodecylphenyl)iodonium salt, and a bis(4-methoxyphenyl)iodonium salt.

Examples of the selenium salt include a triarylselenium salt, such as a triphenylselenium salt, a tri-p-tolylselenium salt, a tri-o-tolylselenium salt, a tris(4-methoxyphenyl)selenium salt, and a 1-naphthyldiphenylselenium salt; a diarylselenium salt, such as a diphenylphenacylselenium salt, a diphenylbenzylselenium salt, and a diphenylmethylselenium salt; a monoarylselenium salt, such as a phenylmethylbenzylselenium salt; and a trialkylselenium salt, such as a dimethylphenacylselenium salt.

Examples of the ammonium salt include tetraalkyl ammonium salts, such as a tetramethyl ammonium salt, an ethyltrimethyl ammonium salt, a diethyldimethyl ammonium salt, a triethylmethyl ammonium salt, a tetraethyl ammonium salt, a trimethyl-n-propyl ammonium salt, and a trimethyl-n-butyl ammonium salt; pyrrolidium salts, such as an N,N-dimethylpyrrolidium salt and an N-ethyl-N-methylpyrrolidium salt; imidazolinium salts, such as an N,N'-dimethylimidazolinium salt and an N,N'-diethylimidazolinium salt; tetrahydropyrimidium salts, such as an N,N'-dimethyltetrahydropyrimidium salt and an N,N'-diethyltetrahydropyrimidium salt; morpholinium salts, such as an N,N-dimethylmorpholinium salt and an N,N-diethylmorpholinium salt; piperidinium salts, such as an N,N-dimethylpiperidinium salt and an N,N-diethylpiperidinium salt; pyridinium salts, such as an N-methylpyridinium salt and an N-ethylpyridinium salt; imidazolium salts, such as an N,N'-dimethylimidazolium salt; quinolium salts, such as an N-methylquinolium salt; isoquinolium salts, such as an N-methylisoquinolium salt; thiazonium salts, such as a benzylbenzothiazonium salt; and acrydium salts, such as a benzylacrydium salt.

Examples of the phosphonium salt include tetraarylphosphonium salts, such as a tetraphenylphosphonium salt, a tetra-p-tolylphosphonium salt, and a tetrakis(2-methoxyphenyl)phosphonium salt; triarylphosphonium salts, such as a triphenylbenzylphosphonium salt; and tetraalkylphosphonium salts, such as a triethylbenzylphosphonium salt, a tributylbenzylphosphonium salt, a tetraethylphosphonium salt, a tetrabutylphosphonium salt, and a triethylphenacylphosphonium salt.

Examples of the salt of a transition metal complex ion include a salt of a chromium complex cation, such as $(\eta^5$-cyclopentadienyl$)(\eta^6$-toluene$)Cr^+$ and $(\eta^5$-cyclopentadienyl$)(\eta^6$-xylene$)Cr^+$; and a salt of an iron complex cation, such as $(\eta^5$-cyclopentadienyl$)(\eta^6$-toluene$)Fe^+$ and $(\eta^5$-cyclopentadienyl$)(\eta^6$-xylene$)Fe^+$.

Examples of the thermal cationic polymerization initiator include arylsulfonium salts, aryliodonium salts, allene-ion complexes, quaternary ammonium salts, aluminum chelates, and boron trifluoride amine complexes.

Examples of the anion constituting the salt in the thermal cationic polymerization initiator include the same examples as those anions constituting the salt of the photocationic polymerization initiators described above.

In the insulating film forming composition according to an embodiment of the present invention, commercially available products such as, for example, "SP-66" and "SP-77" (trade names, available from ADEKA Corporation); and "SAN-AID SI-60L", "SAN-AID SI-80 L", "SAN-AID SI-100L" and "SAN-AID SI-150 L" (trade names, available from Sanshin Chemical Industry Co., Ltd.) can be used.

Examples of the aluminum chelate include ethylacetoacetate aluminum diisopropylate and aluminum tris(ethylacetoacetate).

Examples of the boron trifluoride amine complex include a boron trifluoride monoethyl amine complex, a boron trifluoride imidazole complex, and a boron trifluoride piperidine complex.

The content amount (blending amount) of the cationic polymerization initiator in the insulating film forming composition according to an embodiment of the present invention is not particularly limited, but is, for example, from 0.01 to 5.0 parts by weight per 100 parts by weight of the polymerizable compound contained in the insulating film forming composition, and the lower limit is more preferably 0.05 parts by weight, even more preferably 0.1 parts by weight, and particularly preferably 0.5 parts by parts. When the content amount of the cationic polymerization initiator is set to 0.01 parts by weight or greater, the curing reaction can be efficiently and sufficiently advanced, and a cured product having heat resistance and low curing shrinkage can be obtained. On the other hand, when the content amount of the photocationic polymerization initiator is set to 5.0 parts by weight or less, the storage properties of the insulating film forming composition are improved.

The insulating film forming composition according to an embodiment of the present invention may contain one or more curing accelerators along with the cationic polymerization initiator or in place of the cationic polymerization initiator.

The curing accelerator is a compound having a function of accelerating the curing speed when the polymerizable compound of the insulating film forming composition according to an embodiment of the present invention is cured, and examples include 1,8-diazabicyclo[5.4.0]undecene-7 (DBU), and salts thereof (for example, phenol salts, octylate, p-toluene sulfonate, formate, and tetraphenylborate); 1,5-diazabicyclo[4.3.0]nonene-5 (DBN), and salts thereof (for example, phosphonium salts, sulfonium salts, quaternary ammonium salts, iodonium salts); tertiary amines such as benzyl dimethylamine, 2,4,6-tris(dimethylaminomethyl)phenol, and N,N-dimethylcyclohexylamine; imidazoles such as 2-ethyl-4-methyl imidazole and 1-cyanoethyl-2-ethyl-4-methyl imidazole; phosphines such as phosphates and triphenylphosphine; phosphonium compounds such as tetraphenylphosphonium tetra(p-tolyl) borate; organometallic salts such as tin octylate and zinc octylate; and metal chelates. One type alone or two or more types thereof in combination can be used.

As the curing accelerator, commercially available products can be used, including, for example, "U-CAT SA 506", "U-CAT SA 102", "U-CAT 5003", and "U-CAT 18X" (trade names, the above are available from San-Apro Ltd.); "TPP-K" and "TPP-MK" (trade names, available from Hokko Chemical Industry Co., Ltd.), and "PX-4ET" (trade name, available from Nippon Chemical Industrial Co., Ltd.).

The content amount of the curing accelerator is, for example, preferably approximately 0.01 to 5.0 parts by weight, more preferably from 0.02 to 3.0 parts by weight, particularly preferably from 0.05 to 3.0 parts by weight, and most preferably from 0.1 to 2.0 parts by weight per 100 parts by weight of the polymerizable compound contained in the insulating film forming composition according to an embodiment of the present invention.

The insulating film forming composition according to an embodiment of the present invention may further include, as another optional component, a commonly used additive, such as an insulating material (for example, silver nanowire, alumina nanofiber, cellulose (for example, cellulose acetate)), a curing auxiliary, a solvent (for example, an organic solvent such as PEGMEA), a stabilizer (such as an antioxidant, an ultraviolet absorber, a light-resistant stabilizer, a heat stabilizer, and a heavy metal inactivator), a flame retardant (such as a phosphorus-based flame retardant, a halogen-based flame retardant, and an inorganic flame retardant), a flame retardant auxiliary, a reinforcing material (such as an additional filler), a nucleating agent, a coupling agent (such as a silane coupling agent), a lubricant, a wax, a plasticizer, a releasing agent, an impact resistance modifier, a hue modifier, a transparentizing agent, a rheology modifier (such as a fluidity modifier), a processability modifier, a colorant (such as a dye and a pigment), an antistatic agent, a dispersant, a surface adjusting agent (such as a leveling agent and a welling-up prevention agent), a surface modifier (such as a slipping agent), a matting agent, an antifoaming agent, a foam inhibitor, a deforming agent, an antibacterial agent, a preservative, a viscosity modifier, a thickening agent, a photosensitizer, and a foaming agent. One type alone or two or more types of these additives in combination can be used.

The insulating film forming composition according to an embodiment of the present invention can be prepared by, but not particularly limited to, agitating and mixing each component described above at room temperature or under heating as necessary. Here, the insulating film forming composition according to an embodiment of the present invention can be used as a one-part composition in which each of the components is mixed beforehand, and the mixture is used as is, or alternatively, can be used as a multi-part (for example, two-part) composition of which two or more components are separately stored and then mixed at a predetermined ratio before use prior to use.

To form an insulating film through the SOD method, the insulating film forming composition according to an embodiment of the present invention is preferably a liquid at ambient temperature (approximately 25° C.), and the viscosity is, for example, approximately 1 to 100 mPa·s, preferably from 1 to 20 mPa·s, and particularly preferably from 1 to 10 mPa·s. Here, the viscosity of the insulating film forming composition according to an embodiment of the present invention is measured using a viscometer (trade name "MCR301", available from Anton Paar GmbH) under conditions of a swing angle of 5%, a frequency of from 0.1 to 100 (1/s), and a temperature of 25° C.

[Insulating Film]

The insulating film according to an embodiment of the present invention is formed from a cured product of the above insulating film forming composition. The insulating film according to an embodiment of the present invention can be formed by coating the insulating film forming composition to a surface of a wafer, and in a case where the composition contains a solvent, removing the solvent by heating after coating, and then curing the obtained coating film by irradiating with active energy rays and/or heat treating.

Examples of methods that can be used to coat the aforementioned insulating film forming composition to a surface of a wafer include the SOD method (=spin coating), roll coating application, spray coating, brush coating, bar coating application, roller coating, and silk screen printing.

The thickness of the insulating film (total thickness when two or more layers are provided) is, for example, from 50 to 1000 nm, preferably from 50 to 300 nm, and particularly preferably from 50 to 250 nm.

As the active energy rays, for example, any of infrared rays, visible light rays, ultraviolet rays, X-rays, an electron beam, α-rays, β-rays, and γ-rays can be used. Among these, ultraviolet ray is preferable in terms of excelling in handling ease.

The conditions for curing the coating film by irradiation with active energy rays are not particularly limited, and can be appropriately adjusted according to the type and energy of the active energy rays to be irradiated, and the shape and size of the cured product, and in the case of irradiation with an ultraviolet rays, the irradiation condition thereof is, for example, preferably approximately from 1 to 1000 mJ/cm$^2$. In addition, for example, a high-pressure mercury lamp, an ultra-high-pressure mercury lamp, a xenon lamp, a carbon arc, a metal halide lamp, sunlight, an LED lamp, or a laser can be used for irradiation with active energy rays. After irradiation with active energy rays, the curing reaction can be allowed to further proceed by further subjecting to a heating treatment (annealing and aging).

The heating treatment conditions when curing the coating film are not particularly limited, but are, for example, preferably from 30 to 200° C., and more preferably from 50 to 190° C. The curing time is, for example, approximately from 0.5 to 10 hours.

The insulating film according to an embodiment of the present invention obtained by the method described above has high heat resistance, and the 1% weight loss temperature is, for example, 260° C. or higher. Furthermore, the insulating film according to an embodiment of the present invention exhibits low curing shrinkage. Therefore, even in a case where a semiconductor wafer is made thinner, the occurrence of "warpage" in high temperature environments can be suppressed.

[Semiconductor Device]

The semiconductor device according to an embodiment of the present invention is provided with at least one layer of the above insulating film (for example, an interlayer insulating film). Examples of semiconductor devices include silicon-based transistors, GnN transistors, and other such power transistors, and organic transistors. Since the electronic device according to an embodiment of the present invention has the insulating film described above, the occurrence of "warpage" can be suppressed even in high-temperature environments. Therefore, the present invention can support the demand for further miniaturization and higher integration of semiconductor devices, and the semiconductor device can be mounted on a substrate by reflow soldering together with other components in one batch, and can be manufactured with excellent work efficiency.

EXAMPLES

Hereinafter, the present invention is described in more detail based on examples, but the present invention is not limited by these examples.

Note that the molecular weight of the product was determined by GPC analysis under the following conditions.

Alliance HPLC System 2695 (available from Waters)
Refractive Index Detector 2414 (available from Waters)
Column: Tskgel GMH$_{HR}$-M (available from Tosoh Corporation), quantity of 2
Guard column: Tskgel guard column H$_{HR}$L (available from Tosoh Corporation)
Column oven: Column Heater U-620 (available from Sugai)
Solvent: THF
Measurement Condition: 40° C.

In addition, the molar ratio [T3 forms/T2 forms] of the T2 forms and T3 forms in the product was measured through $^{29}$Si-NMR spectrum measurement using a JEOL ECA500 (500 MHz).

The T0 (5% weight loss temperature) of the product was measured through thermogravimetric analysis (TGA) at a temperature increase rate of 5° C./min in an air atmosphere.

Synthesis Example 1 <Synthesis of Incomplete Cage-Type Polyorganosilsesquioxane>

Amounts of 161.5 mmol (39.79 g) of 2-(3,4-epoxycyclohexyl)ethyltrimethoxysilane, 9 mmol (1.69 g) of phenyltrimethoxysilane, and 165.9 g of acetone were charged under a nitrogen stream into a 300-mL flask (reaction vessel) equipped with a thermometer, a stirrer, a reflux condenser, and a nitrogen inlet tube, and the temperature was raised to 50° C. To the mixture thus obtained, 4.70 g of a 5% potassium carbonate aqueous solution (1.7 mmol as potassium carbonate) was added over 5 minutes, after which 30.60 g of water was added over 20 minutes. Subsequently, a polycondensation reaction was performed under a nitrogen stream for 4 hours while maintaining the temperature at 50° C.

After the polycondensation reaction, the product in the reaction solution was analyzed, and the number-average molecular weight was found to be 1911, and the molecular weight dispersity was found to be 1.47. The [T3 forms/T2 forms] ratio of the product was 10.3.

Subsequently, the reaction solution was cooled and washed with water until the lower layer liquid became neutral. The upper layer liquid was collected, and then the solvent was removed by distillation from the upper layer liquid under conditions of 1 mmHg and 40° C., and a colorless transparent liquid product (epoxy group-containing polyorganosilsesquioxane (S-1)) was obtained.

The T$^{d5}$ of the product was 370° C.

Note that when the FT-IR spectrum of the obtained polyorganosilsesquioxane was measured by the method described above, it was confirmed that each case had one inherent absorption peak near 1100 cm$^{-1}$.

Synthesis Example 2 <Synthesis of Incomplete Cage-Type Polyorganosilsesquioxane>

An epoxy group-containing polyorganosilsesquioxane (S-2) was obtained in the same manner as in Synthesis Example 1 with the exception that the usage amount of the 2-(3,4-epoxycyclohexyl)ethyltrimethoxysilane was changed to 26.9 mmol (6.63 g), and the usage amount of the phenyltrimethoxysilane was changed to 54 mmol (10.1 g).

After the polycondensation reaction, the product in the reaction solution was analyzed, and the number-average molecular weight was found to be 1314, and the molecular weight dispersity was found to be 1.39. The [T3 forms/T2 forms] ratio of the product was 10.1.

Synthesis Example 3 <Synthesis of Ladder-Type Polyorganosilsesquioxane>

Amounts of 890 mmol (218.91 g) of 2-(3,4-cyclohexenyl)ethyltrimethoxysilane, 50 mmol (9.92 g) of phenyltrimethoxysilane, and 114.39 g of methyl isobutyl ketone were charged under a nitrogen stream into a 1000-mL flask (reaction vessel) equipped with a thermometer, a stirrer, a reflux condenser, and a nitrogen inlet tube, and the contents were cooled to 10° C. An amount of 2.0 g of a 5N—HCl aqueous solution (10 mmol as hydrochloric acid) was added into the mixture thus obtained, after which 54.0 g of water was added dropwise over 60 minutes. Subsequently, a polycondensation reaction was performed under a nitrogen stream for 1 hour while maintaining the temperature at 10° C.

After the polycondensation reaction, the product in the reaction solution at this time was analyzed, and the number-average molecular weight was found to be 613, and the molecular weight dispersity was found to be 1.12. Next, 343.21 g of methyl isobutyl ketone was added, and the reaction temperature was increased to 70° C. over 30 minutes. Subsequently, 100 mmol (20.02 g) of 5N—HCl was added at 70° C., and a polycondensation reaction was performed for 3 hours in that state. After the polycondensation reaction, the product in the reaction solution at this time was analyzed, and the number-average molecular weight was found to be 942, and the molecular weight dispersity was found to be 1.14. Furthermore, the [T3 forms/T2 forms] ratio of the product was 1.0.

Next, 500 mmol (81.2 g) of hexamethyldisiloxane was added to the polycondensation reaction solution at 70° C., and a terminal end cap reaction was performed for 3 hours at 70° C. The product was subjected to $^1$H-NMR analysis, and it was found that the conversion rate (TMS conversion rate) from terminal hydroxyl groups to trimethylsilyloxy groups was 75%.

Subsequently, the reaction solution was cooled and washed with water until the lower layer liquid became neutral. The upper layer liquid was collected, and then the solvent was removed by distillation from the upper layer liquid under conditions of 1 mmHg and 50° C., and 169.5 g of a light yellow, transparent liquid product (cyclohexenyl group-containing polyorganosilsesquioxane) was obtained. The number average molecular weight of this concentrated liquid was 1033.

Next, 60.5 g of the concentrated liquid above and 240 g of ethyl acetate were charged under a nitrogen stream into in a 1000 mL flask (reaction vessel) equipped with a thermometer, a stirring device, a reflux condenser, and a nitrogen inlet tube, and the contents were stirred and mixed at 20° C. Separately, 465 mmol of meta-chloroperbenzoic acid (mCPBA) and 240 g of ethyl acetate were charged into an Erlenmeyer flask and stirred and mixed. At a reaction temperature of 20° C., the ethyl acetate solution of mCPBA was added dropwise over 45 minutes. After dropwise addition, the mixture was aged as is for 3 hours at 20° C. At this time, it was confirmed with a peroxide checker that the mCPBA was being eliminated. The reaction solution was quenched by inserting 57.8 g of normal heptane and 231.8 g of a 10% sodium thiosulfate aqueous solution thereto and stirring for 10 minutes. Subsequently, the reaction solution was transferred to a separating funnel, the lower water layer was removed, and extraction and washing were performed twice with 231.8 g of a 5% NaOH aqueous solution, and twice with 231.8 g of water, and the reaction solution was confirmed to be neutral.

An ethyl acetate solution containing an epoxycyclohexylethyl group-containing ladder-type silsesquioxane was concentrated by distilling off the solvent at 1 mmHg and 50° C., and 61.3 g of an epoxycyclohexylethyl group-containing ladder-type silsesquioxane (S-3) was obtained. The epoxy equivalent weight of the obtained epoxycyclohexylethyl group-containing ladder-type silsesquioxane was 260 g/eq, the number average molecular weight was 1062, and the dispersity was 1.12. Through $^1$H-NMR, the conversion rate from a cyclohexenylethyl group prior to epoxidation to an epoxycyclohexylethyl group was confirmed to be 95%. Additionally, the results of the FT-IR analysis indicated that two ladder-specific peaks were present near 1100 cm$^{-1}$ and 1200 cm$^{-1}$, and the [T3 forms/T2 forms] ratio was 1.0, and therefore it was confirmed that the compound contained primarily a ladder skeleton.

Example 1

The components were mixed according to the formulations (units: parts by weight) listed in Table 1, and then the mixture was diluted with propylene glycol 1-monomethyl ether 2-acetate (PGMEA, available from Daicel Corporation) such that the viscosity at 25° C. was 5 mPa·s, and an insulating film forming composition was obtained.

A silane coupling agent (trade name "KBE403", available from Shin-Etsu Chemical Co., Ltd.) was applied by spin coating to a 6-inch silicon wafer, and heated for 5 minutes at 120° C. to obtain a silicon wafer with a silane coupling agent layer.

The curable insulating material was applied to the obtained silicon wafer having a silane coupling agent such that the thickness after drying was 200 nm, after which the material was heated at 100° C. for 5 minutes to remove the solvent, and then the coating film was cured by being subjected to light irradiation 1. The light irradiation was performed using a high-pressure mercury-vapor lamp, and the coating film was irradiated with light with an exposure amount of 1 J/cm$^2$.

Examples 2 to 14 and Comparative Examples 1 and 2

Insulating film forming compositions and insulating films were obtained in the same manner as in Example 1 with the exception that the formulations were varied as described in Table 1, and the curing method was changed. Note that the heating treatment involved heating for 1 hour at 100° C., and then heating for 2 hours at 150° C.

(1) Warpage Measurement

As samples for measuring warpage, the above procedure was repeated five times to create insulating films having a 5-layer laminate structure, and the warpage was measured. Warpage at room temperature (25° C.) of the insulating films obtained in the examples and comparative examples was measured and evaluated according to the following criteria. Note that a laser displacement meter was used to measure the amount of warpage.

Evaluation Criteria

Warpage of 10 m or less: Good warpage suppression (Good)

Warpage exceeding 10 μm and not more than 20 m: Marginal warpage suppression (Marginal)

Warpage exceeding 20 μm: Poor warpage suppression (Poor)

(2) Heat Resistance

The cured products obtained by subjecting the insulating film forming compositions obtained in the examples and comparative examples to photoirradiation or a heating treatment were subjected to thermogravimetric analysis in a nitrogen atmosphere at a temperature increase rate of 10° C./min using a thermal analyzer (trade name "TG-DTA6300", available from Seiko Instruments & Electronics, Ltd.), and the heat resistance was evaluated according to the following criteria.

Evaluation Criteria

1% weight loss temperature of 260° C. or higher: Good heat resistance (Good)

1% weight loss temperature of less than 260° C.: Poor heat resistance (Poor)

(3) Adhesion

The insulating film/inch silicon wafer laminates obtained in the examples and comparative examples were subjected to a cross-cut tape test (in accordance with JIS K5400-8.5), and the adhesion of the insulating film to the inch silicon wafer was evaluated based on the following criteria.

Evaluation Criteria

No delamination of the insulating film was observed: Good adhesion (Good)

Delamination of the insulating film was observed: Poor adhesion (Poor)

TABLE 1

| | | Functional Group Equivalent Weight [g/eq] | Examples | | | | | | | |
|---|---|---|---|---|---|---|---|---|---|---|
| | | | 1 | 2 | 3 | 4 | 5 | 6 | 7 | 8 |
| Polyorganosilsesquioxane | S-1 | 197.64 | 100 | 100 | 50 | 50 | 50 | 50 | 50 | 70 |
| | S-2 | 454.68 | | | 50 | | | | | |
| | S-3 | 197.64 | | | | 50 | | | | |
| Polymerizable Compound | 4005P | 1075 | | | | | | 50 | | |
| | EXA-4850-150 | 433 | | | | | 50 | | | |
| | EHPE3150 | 177 | | | | | | | 50 | |
| | OXT-121 | 213 | | | | | | | | 30 |
| | X-22-163 | 200 | | | | | | | | |
| | Rikacid MH700F | 164.5 | | | | | | | | |
| | TD2091 | 105 | | | | | | | | |
| Cationic polymerization initiator | CPI-110P | | 3.00 | | | | | | | |
| | SI-150L | | | 3.00 | 3.00 | 3.00 | 3.00 | 3.00 | 3.00 | 3.00 |
| Curing accelerator | U-CAT 18X | | | | | | | | | |
| | TPP | | | | | | | | | |
| Insulating material | Cellulose | | | | | | | | | |
| | Alumina nanofibers | | | | | | | | | |
| Curing conditions | | | UV | Heat | Heat | Heat | Heat | Heat | Heat | Heat |
| Evaluation Results | Warpage | | Good | Good | Good | Good | Good | Good | Good | Good |
| | Heat resistance | | Good | Good | Good | Good | Good | Good | Good | Good |
| | Adhesion | | Good | Good | Good | Good | Good | Good | Good | Good |

| | | Functional Group Equivalent Weight [g/eq] | Examples | | | | | | Comparative Examples | |
|---|---|---|---|---|---|---|---|---|---|---|
| | | | 9 | 10 | 11 | 12 | 13 | 14 | 1 | 2 |
| Polyorganosilsesquioxane | S-1 | 197.64 | 50 | 57 | 65 | 40 | 40 | | | |
| | S-2 | 454.68 | | | | 40 | 40 | | | |
| | S-3 | 197.64 | | | | | | 100 | | |
| Polymerizable Compound | 4005P | 1075 | | | | | | | | |
| | EXA-4850-150 | 433 | | | | | | | | |
| | EHPE3150 | 177 | | | | | | | 80 | 50 |
| | OXT-121 | 213 | | | | | | | 20 | |
| | X-22-163 | 200 | 50 | | | | | | | 50 |
| | Rikacid MH700F | 164.5 | | 43 | | | | | | |
| | TD2091 | 105 | | | 35 | | | | | |
| Cationic polymerization initiator | CPI-110P | | | | | | | | | |
| | SI-150L | | 3.00 | | 0.50 | 3.00 | 3.00 | 3.00 | 3.00 | 3.00 |
| Curing accelerator | U-CAT 18X | | | | 0.50 | | | | | |
| | TPP | | | | 1.00 | | | | | |
| Insulating material | Cellulose | | | | | 20 | | | | |
| | Alumina nanofibers | | | | | | 20 | | | |
| Curing conditions | | | Heat | Heat | Heat | Heat | Heat | Heat | Heat | Heat |
| Evaluation Results | Warpage | | Good | Good | Good | Good | Good | Marginal | Poor | Poor |
| | Heat resistance | | Good | Good | Good | Good | Good | Good | Poor | Good |
| | Adhesion | | Good | Good | Good | Good | Good | Good | Good | Poor |

<Polyorganosilsesquioxane>

S-1: The product obtained in Synthesis Example 1 was used.

S-2: The product obtained in Synthesis Example 2 was used.

S-3: The product obtained in Synthesis Example 3 was used.

<Polymerizable Compounds>

4005P: Bisphenol F type diglycidyl ether, available from Mitsubishi Chemical Corporation EXA-4850-150: Bisphenol A type diglycidyl ether, trade name: "EPICLON EXA-4850-150", available from DIC Corporation EHPE3150: 1,2-epoxy-4-(2-oxiranyl)cyclohexane adduct of 2,2-bis(hydroxymethyl)-1-butanol, available from Daicel Corporation OXT-121: 1,4-bis[(3-ethyl-3-oxetanylmethoxy)methyl] benzene, trade name: "Aron Oxetane OXT-121", available from Toagosei Co., Ltd.

X-22-163: Glycidyl modified silicone oil, available from Shin-Etsu Silicone Co., Ltd.

Rikacid MH700F: 4-methylhexahydrophthalic anhydride/hexahydrophthalic anhydride=70/30, available from Nippon Rika Inc.

TD 2091: Novolac type phenolic resin, trade name "PHENOLITE TD-2091", available from DIC Corporation <Cationic Polymerization Initiator>

CPI-110P: Photocationic polymerization initiator, diphenyl [4-(phenylthio)phenyl]sulfonium hexafluorophosphate, available from San-Apro Ltd.

SI-150L: Thermal cationic polymerization initiator, trade name: "SAN-AID SI-150 L", available from Sanshin Chemical Industry Co., Ltd.

<Curing Accelerator>

U-CAT 18X: special amine, available from San-Apro Ltd.

TPP: Triphenylphosphine, available from Wako Pure Chemical Industries, Ltd.

<Insulating Material>

Cellulose: Cellulose acetate (L-20), available from Daicel Corporation

Alumina nanofiber: Available from New Metals and Chemicals Corporation

As a summary of the above, configurations of the present invention and variations thereof are described below.

[1] A composition containing, as a polymerizable compound, a polyorganosilsesquioxane made from siloxane constituent units; wherein a total of:

constituent units represented by the following formula (I):

$$[R^a SiO_{3/2}] \quad (I)$$

[wherein, $R^a$ denotes an epoxy group-containing group, a substituted or unsubstituted aryl group, a substituted or unsubstituted aralkyl group, a substituted or unsubstituted cycloalkyl group, a substituted or unsubstituted alkyl group, a substituted or unsubstituted alkenyl group, or a hydrogen atom]; and constituent units represented by the following formula (II):

$$[R^a SiO_{2/2}(OR^b)] \quad (II)$$

[wherein, $R^a$ is the same as described above; and $R^b$ denotes a hydrogen atom or an alkyl group having from 1 to 4 carbon atoms]

is greater than or equal to 55 mol % of a total amount of the siloxane constituent units; and the polyorganosilsesquioxane has a number average molecular weight of from 500 to 10000 and an epoxy equivalent weight of from 200 to 2000 g/eq.

[2] The composition according to [1], wherein the epoxy group-containing group is at least one type of group selected from the group consisting of the following formulas (1a) to (1d):

[Chem. 8]

(1a)

(1b)

(1c)

(1d)

(wherein, $R^{1a}$, $R^{1b}$, $R^{1c}$, and $R^{1d}$ may be the same or different, and denote linear or branched alkylene groups).

[3] The composition according to [2], wherein in the formulas, $R^{1a}$, $R^{1b}$, $R^{1c}$, and $R^{1d}$ may be the same or different, and denote linear or branched alkylene groups, and are selected from linear or branched alkylene groups having from 1 to 10 carbon atoms, including a methylene group, a methyl methylene group, a dimethyl methylene group, an ethylene group, a propylene group, a trimethylene group, a tetramethylene group, a pentamethylene group, a hexamethylene group, and a decamethylene group.

[4] The composition according to [2] or [3], wherein $R^b$ in the formula is a hydrogen atom or an alkyl group having from 1 to 4 carbon atoms, and the ($OR^b$) group in the formula is a hydroxyl group or an alkoxy group having from 1 to 4 carbon atoms; and examples of the alkoxy group having from 1 to 4 carbon atoms include a methoxy group, an ethoxy group, a propoxy group, an isopropoxy group, a butoxy group, and an isobutyloxy group.

[5] The composition according to any one of [1] to [4], wherein a number average molecular weight (Mn) of the polyorganosilsesquioxane by GPC calibrated with standard polystyrene is from 500 to 10000, from 700 to 5000, from 800 to 3000, from 900 to 2800, from 1000 to 2600, or from 1100 to 2000.

[6] The composition according to any one of [1] to [5], wherein the epoxy equivalent weight of the polyorganosilsesquioxane is from 200 to 2000 g/eq, from 200 to 1800 g/eq, from 200 to 1500 g/eq, from 200 to 1200 g/eq, or from 205 to 1000 g/eq.

[7] The composition according to any one of [1] to [6], further containing, as a polymerizable compound, a compound (excluding those containing a siloxane constituent unit) having at least one polymerizable group selected from a group consisting of an epoxy group, an oxetanyl group, a vinyl ether group, an acid anhydride group, and a phenolic hydroxyl group, at an amount in a range of 150 parts by weight or less per 100 parts by weight of the polyorganosilsesquioxane.

[8] The composition according to any one of [1] to [7], further containing a cationic polymerization initiator and/or a curing accelerator.

[9] The composition according to [8], wherein the cationic polymerization initiator is a photocationic polymerization initiator (photo acid generator) or a thermal cationic polymerization initiator (thermal acid generator); the photocationic polymerization initiator is selected from the group consisting of a sulfonium salt (a salt of a sulfonium ion and an anion), an iodonium salt (a salt of an iodonium ion and an anion), a selenium salt (a salt of a selenium ion and an anion), an ammonium salt (a salt of an ammonium ion and an anion), a phosphonium salt (a salt of a phosphonium ion and an anion), and a salt of a transition metal complex ion and an anion; and the thermal cationic polymerization initiator is selected from the group consisting of arylsulfonium salts, aryliodonium salts, allene-ion complexes, quaternary ammonium salts, aluminum chelates, and boron trifluoride amine complexes.

[10] The composition according to any one of [1] to [9], wherein the composition is an insulating film forming composition.

[11] An insulating film made from a cured product of a composition according to any one of [1] to [10].

[12] A method for manufacturing an insulating film, the method including coating a composition described in any one of [1] to [10] to a surface of a wafer or the like, and in a case where the composition contains a solvent, removing the solvent by heating after coating, and then curing an obtained coating film by irradiating with active energy beams and/or heat treating to thereby manufacture the insulating film according to [11].

[13] A semiconductor device provided with the insulating film described in [11] or [12].

[14] The semiconductor device according to [13], wherein the insulating film is an interlayer insulating film.

[15] The semiconductor device according to [13] or [14], wherein the semiconductor device is selected from the group consisting of silicon based transistors, GnN transistors, and organic transistors.

[16] Use of a composition containing, as a polymerizable compound, a polyorganosilsesquioxane made from siloxane constituent units, to form an insulating film; wherein a total of:

constituent units represented by the following formula (I):

[R$^a$SiO$_{3/2}$]  (I)

[wherein, R$^a$ denotes an epoxy group-containing group, a substituted or unsubstituted aryl group, a substituted or unsubstituted aralkyl group, a substituted or unsubstituted cycloalkyl group, a substituted or unsubstituted alkyl group, a substituted or unsubstituted alkenyl group, or a hydrogen atom]; and constituent units represented by the following formula (II):

[R$^a$SiO$_{2/2}$(OR$^b$)]  (II)

[wherein, R$^a$ is the same as described above; and R$^b$ denotes a hydrogen atom or an alkyl group having from 1 to 4 carbon atoms]

is greater than or equal to 55 mol % of a total amount of the siloxane constituent units; and the polyorganosilsesquioxane has a number average molecular weight of from 500 to 10000 and an epoxy equivalent weight of from 200 to 2000 g/eq.

[17] The use for insulating film formation according to [16], wherein the epoxy group-containing group is at least one type of group selected from the group consisting of the following formulas (1a) to (1d):

[Chem. 9]

(1a)

(1b)

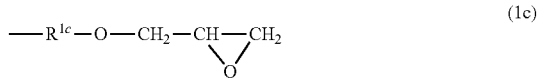
(1c)

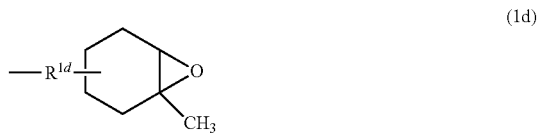
(1d)

(wherein, R$^{1a}$, R$^{1b}$, R$^{1c}$, and R$^{1d}$ may be the same or different, and denote linear or branched alkylene groups).

[18] The use for insulating film formation according to [17], wherein in the formulas, R$^{1a}$, R$^{1b}$, R$^{1c}$, and R$^{1d}$ may be the same or different, and denote linear or branched alkylene groups, and are selected from linear or branched alkylene groups having from 1 to 10 carbon atoms, including a methylene group, a methyl methylene group, a dimethyl methylene group, an ethylene group, a propylene group, a trimethylene group, a tetramethylene group, a pentamethylene group, a hexamethylene group, and a decamethylene group.

[19] The use for insulating film formation according to [17] or [18], wherein R$^b$ in the formula is a hydrogen atom or an alkyl group having from 1 to 4 carbon atoms, and the (OR$^b$) group in the formula is a hydroxyl group or an alkoxy group having from 1 to 4 carbon atoms; and examples of the alkoxy group having from 1 to 4 carbon atoms include a methoxy group, an ethoxy group, a propoxy group, an isopropoxy group, a butoxy group, and an isobutyloxy group.

[20] The use for insulating film formation according to any one of [16] to [19], wherein a number average molecular weight (Mn) of the polyorganosilsesquioxane by GPC calibrated with standard polystyrene is from 500 to 10000, from 700 to 5000, from 800 to 3000, from 900 to 2800, from 1000 to 2600, or from 1100 to 2000.

[21] The use for insulating film formation according to any one of [16] to [20], wherein the epoxy equivalent weight of the polyorganosilsesquioxane is from 200 to 2000 g/eq, from 200 to 1800 g/eq, from 200 to 1500 g/eq, from 200 to 1200 g/eq, or from 205 to 1000 g/eq.

[22] The use for insulating film formation according to any one of [16] to [21], the composition further containing, as a polymerizable compound, a compound (excluding those containing a siloxane constituent unit) having at least one polymerizable group selected from the group consisting of an epoxy group, an oxetanyl group, a vinyl ether group, an acid anhydride group, and a phenolic hydroxyl group, at an amount in a range of 150 parts by weight or less per 100 parts by weight of the polyorganosilsesquioxane.

[23] The use for insulating film formation according to any one of [16] to [22], the composition further containing a cationic polymerization initiator and/or a curing accelerator.

[24] The use for insulating film formation according to [23], wherein the cationic polymerization initiator is a photocationic polymerization initiator (photo acid generator) or a thermal cationic polymerization initiator (thermal acid generator); the photocationic polymerization initiator is selected from the group consisting of a sulfonium salt (a salt of a sulfonium ion and an anion), an iodonium salt (a salt of an iodonium ion and an anion), a selenium salt (a salt of a selenium ion and an anion), an ammonium salt (a salt of an ammonium ion and an anion), a phosphonium salt (a salt of a phosphonium ion and an anion), and a salt of a transition metal complex ion and an anion; and the thermal cationic polymerization initiator is selected from the group consisting of arylsulfonium salts, aryliodonium salts, allene-ion complexes, quaternary ammonium salts, aluminum chelates, and boron trifluoride amine complexes.

INDUSTRIAL APPLICABILITY

The insulating film forming composition according to an embodiment of the present invention can be used to form an insulating film that excels in insulating properties and heat resistance, suppresses the occurrence of warpage, and excels in adhesion by coating the composition and then subjecting the coated composition to photoirradiation and/or a heating treatment. Therefore, the present invention exhibits excellent operation efficiency and does not require a large-scale device.

Furthermore, even in a case where the semiconductor wafer is made thinner, a semiconductor device provided with the abovementioned insulating film can suppress the occurrence of "warpage" in high temperature environments. Therefore, the present invention can support the demand for further miniaturization and higher integration of semiconductor devices, and the semiconductor device can be mounted on a substrate by reflow soldering together with other components in one batch, and can be manufactured with excellent work efficiency.

Accordingly, the insulating film forming composition according to an embodiment of the present invention can be suitably used in insulation film forming applications for semiconductor devices (for example, a silicon-based transistor, a GaN transistor, and other such power transistors; organic transistors, and other transistors).

The invention claimed is:

1. An insulating film forming composition comprising, as a polymerizable compound, an incomplete cage-type polyorganosilsesquioxane including siloxane constituent units; wherein a total of:
constituent units represented by Formula (I):

where $R^a$ denotes an epoxy group-containing group, a substituted or unsubstituted aryl group, a substituted or unsubstituted aralkyl group, a substituted or unsubstituted cycloalkyl group, a substituted or unsubstituted alkyl group, a substituted or unsubstituted alkenyl group, or a hydrogen atom; and
constituent units represented by Formula (II):

where $R^a$ is the same as described above; and $R^b$ denotes a hydrogen atom or an alkyl group having from 1 to 4 carbon atoms,
is greater than or equal to 55 mol % of a total amount of the siloxane constituent units; and the polyorganosilsesquioxane has a number average molecular weight of from 500 to 10000, a molar ratio of the constituent unit represented by Formula (I) to the constituent unit represented by Formula (II) is 5 to 20, and an epoxy equivalent weight of from 200 to 2000 g/eq;
wherein $R^a$ in at least one of the constituent units represented by Formula (I) or Formula (II) is an epoxy group-containing group and the epoxy group-containing group is at least one type of group selected from the group consisting of the following formulas (1a) to (1d):

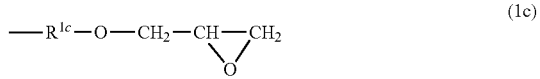

where $R^{1a}$, $R^{1b}$, $R^{1c}$, and $R^{1d}$ are the same or different, and denote linear or branched alkylene groups.

2. The insulating film forming composition according to claim 1, further comprising, as a polymerizable compound, a compound (excluding those containing a siloxane constituent unit) having at least one polymerizable group selected from an epoxy group, an oxetanyl group, a vinyl ether group, an acid anhydride group, and a phenolic hydroxyl group, at an amount in a range of 150 parts by weight or less per 100 parts by weight of the polyorganosilsesquioxane.

3. The insulating film forming composition according to claim 1, further comprising a cationic polymerization initiator and/or a curing accelerator.

4. An insulating film comprising a cured product of the insulating film forming composition described in claim 1.

5. A semiconductor device comprising the insulating film described in claim 4.

6. A method for producing an insulating film, the method comprising using a composition as an insulating film forming composition:
the composition comprising an incomplete cage-type polyorganosilsesquioxane including siloxane constituent units; wherein a total of:
constituent units represented by Formula (I):

where $R^a$ denotes an epoxy group-containing group, a substituted or unsubstituted aryl group, a substituted or unsubstituted aralkyl group, a substituted or unsubstituted cycloalkyl group, a substituted or unsubstituted alkyl group, a substituted or unsubstituted alkenyl group, or a hydrogen atom; and
constituent units represented by Formula (II):

where $R^a$ is the same as described above; and $R^b$ denotes a hydrogen atom or an alkyl group having from 1 to 4 carbon atoms,
is greater than or equal to 55 mol % of a total amount of the siloxane constituent units; and
the polyorganosilsesquioxane has a number average molecular weight of from 500 to 10000, a molar ratio of the constituent unit represented by Formula (I) to the constituent unit represented by Formula (II) is 5 to 20, and an epoxy equivalent weight of from 200 to 2000 g/eq;
wherein $R^a$ in at least one of the constituent units represented by Formula (I) or Formula (II) is an epoxy group-containing group and the epoxy group-containing group is at least one type of group selected from the group consisting of the following formulas (1a) to (1d):

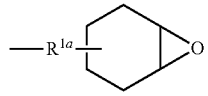
(1a)

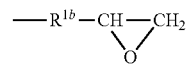
(1b)

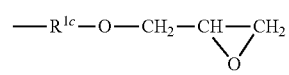
(1c)

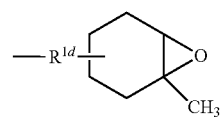
(1d)

where $R^{1a}$, $R^{1b}$, $R^{1c}$, and $R^{1d}$ are the same or different, and denote linear or branched alkylene groups.

* * * * *